United States Patent
Kuriyama et al.

(10) Patent No.: US 10,312,440 B2
(45) Date of Patent: Jun. 4, 2019

(54) VARIABLE RESISTANCE ELEMENT AND MEMORY DEVICE

(71) Applicant: Toshiba Memory Corporation, Minato-ku (JP)

(72) Inventors: Hiromichi Kuriyama, Kuwana (JP); Masumi Saitoh, Yokkaichi (JP); Takayuki Ishikawa, Yokkaichi (JP); Harumi Watanabe, Kawasaki (JP)

(73) Assignee: Toshiba Mitsubishi Corporation, Minato-ku (JP)

( * ) Notice: Subject to any disclaimer, the term of this patent is extended or adjusted under 35 U.S.C. 154(b) by 0 days.

(21) Appl. No.: 15/704,112

(22) Filed: Sep. 14, 2017

(65) Prior Publication Data

US 2018/0269394 A1    Sep. 20, 2018

(30) Foreign Application Priority Data

Mar. 14, 2017  (JP) ................. 2017-048602

(51) Int. Cl.
*H01L 45/00* (2006.01)
*G11C 13/00* (2006.01)
(Continued)

(52) U.S. Cl.
CPC ........ *H01L 45/145* (2013.01); *G11C 11/5614* (2013.01); *G11C 13/0011* (2013.01);
(Continued)

(58) Field of Classification Search
CPC ............... H01L 45/145; H01L 45/1233; H01L 45/1616; G11C 13/0011; G11C 13/0069
(Continued)

(56) References Cited

U.S. PATENT DOCUMENTS 9,985,204 B2 * 5/2018 Lee ............... H01L 45/141
2012/0281452 A1   11/2012 Huo et al.
(Continued)

FOREIGN PATENT DOCUMENTS

JP    2012-169469    9/2012
JP    2012-174754    9/2012
JP    2013-125903    6/2013

OTHER PUBLICATIONS http://www.knowledgedoor.com/2/elements_handbook/silicon.html; all pages.*

*Primary Examiner* — Fernando N Hidalgo
(74) *Attorney, Agent, or Firm* — Oblon, McClelland, Maier & Neustadt, L.L.P.

(57) ABSTRACT

According to one embodiment, a variable resistance element includes first and conductive layers and first and second layers. The first conductive layer includes a first element including at least one selected from the group consisting of silver, copper, aluminum, nickel, and titanium. The second conductive layer includes at least one selected from the group consisting of platinum, gold, iridium, tungsten, palladium, rhodium, titanium nitride, and silicon. A first layer contacts the first conductive layer, and is provided between the first and second conductive layers. The first layer includes a first material. The first material is insulative. The second layer includes a second element and a second material and is provided between the first layer and the second conductive layer. The second element includes at least one selected from the group consisting of silver, copper, aluminum, nickel, and titanium. The second material is different from the first material.

30 Claims, 8 Drawing Sheets

(51) Int. Cl.
  *G11C 11/56* (2006.01)
  *H01L 27/24* (2006.01)
(52) U.S. Cl.
  CPC ...... *G11C 13/0069* (2013.01); *H01L 27/2463* (2013.01); *H01L 45/085* (2013.01); *H01L 45/1233* (2013.01); *H01L 45/141* (2013.01); *H01L 45/146* (2013.01); *H01L 45/1616* (2013.01); *G11C 2213/15* (2013.01); *G11C 2213/54* (2013.01)
(58) Field of Classification Search
  USPC ....... 365/46, 55, 74, 97, 100, 131, 148, 158, 365/171, 173, 163, 230.05
  See application file for complete search history.

(56) References Cited

U.S. PATENT DOCUMENTS

| | | |
|---|---|---|
| 2014/0191184 A1 | 7/2014 | Yamauchi et al. |
| 2014/0322862 A1 | 10/2014 | Xie et al. |
| 2014/0346434 A1 | 11/2014 | Miyagawa et al. |
| 2017/0025605 A1 | 1/2017 | Park et al. |
| 2018/0166630 A1 * | 6/2018 | Tada ...................... H01L 45/00 |

* cited by examiner

STH

Vap<0

Vap=0

Vap>0

STL

Vap<0

Vap=0

Vap>0

| Vap(V) | CS | CH1 | CH2 | CN |
|---|---|---|---|---|
| Read | Vrd | Vrd/2 | Vrd/2 | 0 |
| Set | Vs | Vs/2 | Vs/2 | 0 |
| Reset | Vrs | Vrs/2 | Vrs/2 | 0 |

| Vap(V) | CS | CH1 | CH2 | CN |
|---|---|---|---|---|
| Read | Vrd | Vrd/3 | Vrd/3 | -Vrd/3 |
| Set | Vs | Vs/3 | Vs/3 | -Vs/3 |
| Reset | Vrs | Vrs/3 | Vrs/3 | -Vrs/3 |

VARIABLE RESISTANCE ELEMENT AND MEMORY DEVICE

CROSS-REFERENCE TO RELATED APPLICATIONS

This application is based upon and claims the benefit of priority from Japanese Patent Application No. 2017-048602, filed on Mar. 14, 2017; the entire contents of which are incorporated herein by reference.

FIELD

Embodiments described herein relate generally to a variable resistance element and a memory device.

BACKGROUND

A memory device that uses a variable resistance element has been proposed. Stable operations of the variable resistance element are desirable.

DETAILED DESCRIPTION

Figure 1:
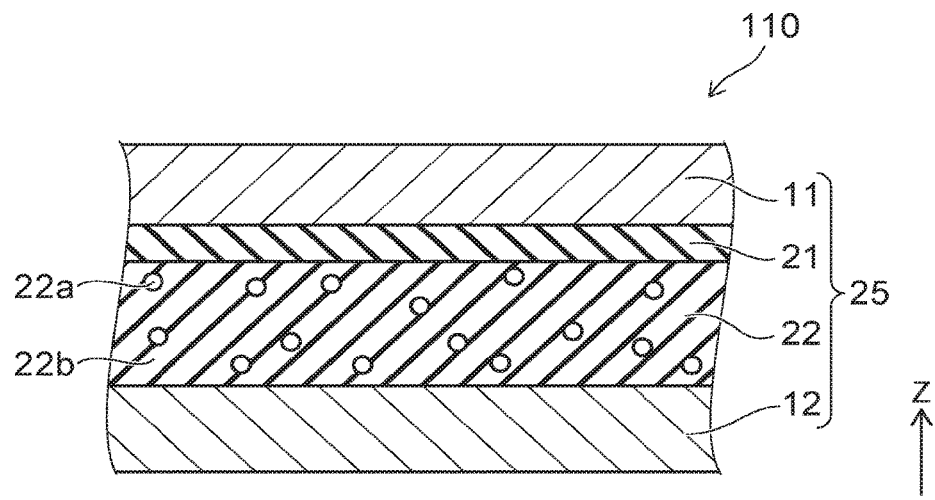
FIG. 1 is a schematic cross-sectional view illustrating a variable resistance element according to a first embodiment.

According to one embodiment, a variable resistance element includes a first conductive layer, a second conductive layer, a first layer, and a second layer. The first conductive layer includes a first element including at least one selected from the group consisting of silver, copper, aluminum, nickel, and titanium. The second conductive layer includes at least one selected from the group consisting of platinum, gold, iridium, tungsten, palladium, rhodium, titanium nitride, and silicon. A first layer contacts the first conductive layer, and is provided between the first conductive layer and the second conductive layer. The first layer includes a first material. The first material is insulative. The second layer includes a second element and a second material and is provided between the first layer and the second conductive layer. The second element includes at least one selected from the group consisting of silver, copper, aluminum, nickel, and titanium. The second material is different from the first material.

According to another embodiment of the invention, a memory device includes the variable resistance element recited above, a first interconnect, a second interconnect, and a controller. The first interconnect is electrically connected to the first conductive layer. The second interconnect is electrically connected to the second conductive layer. The controller is electrically connected to the first interconnect and the second interconnect. The controller is configured to implement a first operation of applying a first voltage to the first interconnect, the first voltage being positive when referenced to a potential of the second interconnect, a second operation of applying a second voltage to the first interconnect, the second voltage being negative when referenced to the potential of the second interconnect, and a third operation of applying a third voltage to the first interconnect, the third voltage being smaller than the first voltage and being positive when referenced to the potential of the second interconnect. The absolute value of a first current flowing in a stacked body via the first interconnect and the second interconnect in the third operation implemented after the first operation is greater than the absolute value of a second current flowing in the stacked body in the third operation implemented after the second operation, the stacked body including the first conductive layer, the second conductive layer, the first layer, and the second layer. The absolute value of a fourth current flowing in the stacked body via the first interconnect and the second interconnect when a fourth voltage is applied to the first interconnect is greater than the absolute value of a fifth current flowing in the stacked body via the first interconnect and the second interconnect when a fifth voltage is applied to the first interconnect, the fourth voltage being positive when referenced to the potential of the second interconnect, the fifth voltage being negative when referenced to the potential of the second interconnect, the fourth voltage being ⅓ of the third voltage, the absolute value of the fifth voltage being ⅓ of the third voltage.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a variable resistance element according to a first embodiment.

As shown in FIG. 1, the variable resistance element 110 according to the embodiment includes a first conductive layer 11, a second conductive layer 12, a first layer 21, and a second layer 22.

The first conductive layer 11 includes a first element. The first element includes at least one selected from the group consisting of silver, copper, aluminum, nickel, and titanium. The first conductive layer 11 is, for example, silver.

The second conductive layer 12 includes at least one selected from the group consisting of platinum, gold, iridium, tungsten, palladium, rhodium, titanium nitride, and silicon. The second conductive layer 12 includes, for example, Si including an impurity. In such a case, the second conductive layer 12 includes, for example, Si doped with a high concentration of phosphorus (P). The resistivity of the second conductive layer 12 is, for example, 0.005 Ωcm or less.

For example, the work function of the first conductive layer 11 is smaller than the work function of the second conductive layer 12. Such a relationship of the work functions is obtained by using the materials recited above.

A direction from the second conductive layer 12 toward the first conductive layer 11 is taken as a Z-axis direction. The Z-axis direction corresponds to the stacking direction.

The first layer 21 is provided between the first conductive layer 11 and the second conductive layer 12. The first layer 21 contacts the first conductive layer 11. The first layer 21 includes a first material. The first material is insulative. The first layer 21 is, for example, aluminum oxide.

The second layer 22 is provided between the first layer 21 and the second conductive layer 12. The second layer 22 includes a second element 22a and a second material 22b. The second element 22a includes at least one selected from the group consisting of silver, copper, aluminum, nickel, and titanium. The second material 22b is different from the first material recited above (the material of the first layer 21). For example, the second element 22a is silver. For example, the second material is hafnium oxide. In the second layer 22, the silver is doped into the hafnium oxide. The concentration of silver in the second layer 22 is, for example, $1 \times 10^{20}$ atoms/cm$^3$ or more. For example, the second layer 22 contacts the first layer 21 and the second conductive layer 12.

The thickness (the length along the Z-axis direction) of the first layer 21 is, for example, not less than 0.2 nanometers (nm) and not more than 1.5 nm. The first layer 21 functions as, for example, a tunneling insulating film. The thickness of the first layer 21 is thinner than the thickness of the second layer 22. The thickness of the second layer 22 is greater than 1.5 nm and not more than 10 nanometers. The second layer 22 functions as a functional portion in which the resistance changes.

The first conductive layer 11, the second conductive layer 12, the first layer 21, and the second layer 22 are included in a stacked body 25. The stacked body 25 functions as one memory cell.

The electrical resistance of the stacked body 25 has multiple mutually-different states. One of the multiple states is a high resistance state STH. Another one of the multiple states is a low resistance state STL. The electrical resistance of the stacked body 25 in the low resistance state STL is lower than the electrical resistance in the high resistance state STH.

Figure 2:
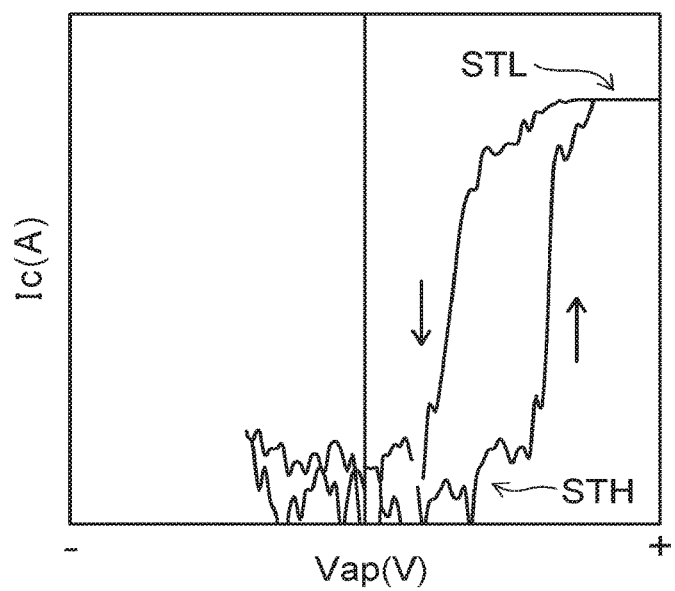
FIG. 2 is a graph illustrating a characteristic of the variable resistance element according to the first embodiment.

FIG. 2 is a graph illustrating a characteristic of the variable resistance element according to the first embodiment.

FIG. 2 illustrates a characteristic of the variable resistance element 110 recited above. In the example, the first conductive layer 11 is a silver layer. The second conductive layer 12 is Si including phosphorus (P). The first layer 21 (the first material) is aluminum oxide. The second layer 22 is hafnium oxide doped with silver.

A current Ic that flows in the stacked body 25 when an applied voltage Vap is applied between the first conductive layer 11 and the second conductive layer 12 is measured. FIG. 2 shows the relationship between the applied voltage Vap and the current Ic. The applied voltage Vap is the potential of the first conductive layer 11 when referenced to the potential of the second conductive layer 12. When the applied voltage Vap is positive, the potential of the first conductive layer 11 is higher than the potential of the second conductive layer 12. When the applied voltage Vap is negative, the potential of the first conductive layer 11 is lower than the potential of the second conductive layer 12. The current Ic is a logarithmic display.

As shown in FIG. 2, when the applied voltage Vap is positive, as the absolute value of the applied voltage Vap is increased, the current Ic becomes large; and the low resistance state STL is obtained. When the absolute value of the applied voltage Vap is reduced from the low resistance state STL, the current Ic becomes small. Further, the current Ic is small also when the applied voltage Vap is set to be negative and the absolute value of the negative applied voltage Vap is increased.

As the positive applied voltage Vap increases and decreases, the characteristic of the current Ic has hysteresis; and multiple states (the high resistance state STH and the low resistance state STL) are obtained. These multiple states are used to store information.

In the low resistance state STL as shown in FIG. 2, the characteristic of the current Ic has a large asymmetry between when the applied voltage Vap is positive and when the applied voltage Vap is negative. The asymmetry is based on the special structure of the stacked body 25 according to the embodiment. As described below, due to the asymmetry, the stacked body 25 (the memory cell) is not easily affected by disturbances when an unintended voltage is applied to the stacked body 25 (the memory cell).

Figure 3A:
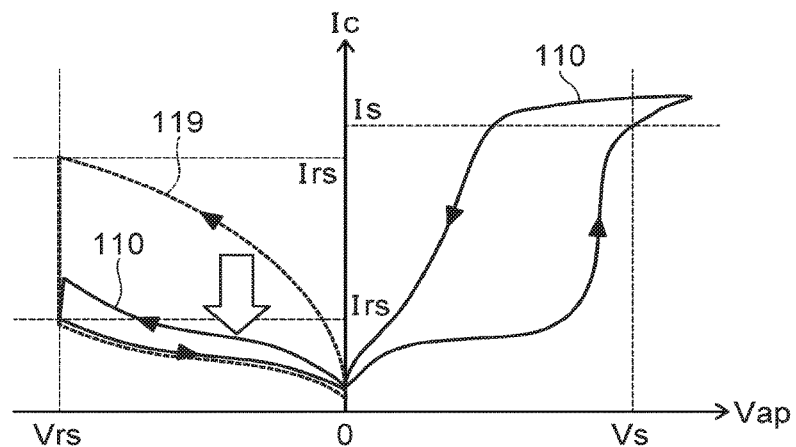
FIG. 3A and FIG. 3B are graphs illustrating characteristics of the variable resistance element.
Figure 3B:
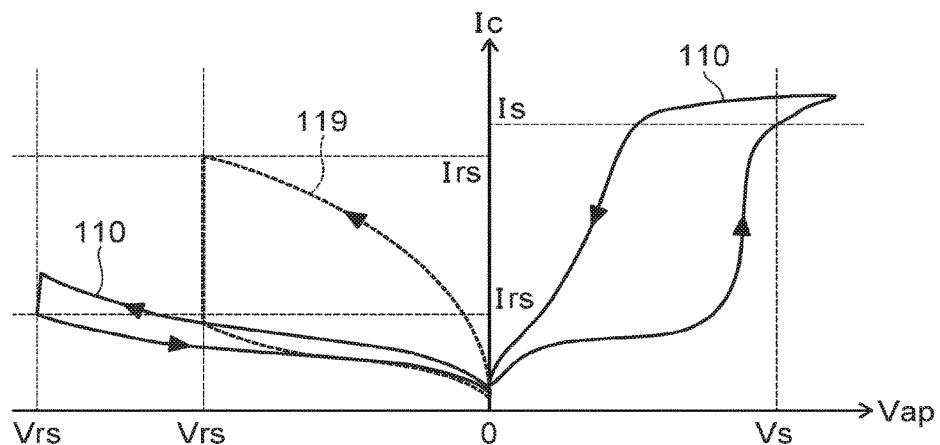

FIG. 3A and FIG. 3B are graphs illustrating characteristics of the variable resistance element.

Characteristics of the variable resistance element 110 according to the embodiment and a variable resistance element 119 of a reference example are illustrated in these figures. In the variable resistance element 119 of the reference example, a titanium oxide layer is provided as a variable resistance layer between a first electrode and a second electrode. The variable resistance element 119 is a generally-known oxide-based variable resistance element. FIG. 3A shows one example of the characteristic of the variable resistance element 110 according to the embodiment. FIG. 3B shows one other example of the characteristic of the variable resistance element 110 according to the embodiment.

In the variable resistance element 119 of the reference example as shown in FIG. 3A and FIG. 3B, when the polarity of the applied voltage Vap is positive, the characteristic is equal to the characteristic of the variable resistance element 110 (the solid line); when negative, the characteristic is illustrated by the broken line; and the characteristic of the current Ic is substantially symmetric.

Conversely, in the one example of the variable resistance element 110 as shown by the solid line of FIG. 3A, the current Ic when the applied voltage Vap is negative is extremely small compared to the current Ic when the applied voltage Vap is positive. In other words, the variable resistance element 110 has a rectifying property in the negative-side bias direction.

For example, the stacked body 25 transitions to the low resistance state STL (the set state or the on-state) when a positive set voltage Vs is applied to the stacked body 25. Then, the stacked body 25 transitions to the high resistance state STH when a negative reset voltage Vrs is applied to the stacked body 25. The current Ic that flows when the set voltage Vs is applied is a set current Is. The current Ic that flows when the reset voltage Vrs is applied is a reset current Irs. The applied voltage Vap at which the magnitude of the current Ic becomes a prescribed value (the set current Is) or more corresponds to the set voltage Vs. The applied voltage Vap at which the magnitude of the current Ic becomes a prescribed value (the reset current Irs) or less corresponds to the reset voltage Vrs.

In the case where the multiple memory cells (the stacked body 25) are provided as described below, a negative voltage (an intermediate voltage) is applied to the unselected cells or the half-selected cells. The absolute value of the negative intermediate voltage is less than the absolute value of the negative reset voltage Vrs. The stacked body 25 undesirably transitions to the high resistance state STH if the current Ic that flows is large when the negative intermediate voltage is applied to the memory cells. In other words, a reset disturbance occurs.

In the characteristic of FIG. 2, the reset disturbance is suppressed when the current Ic is small when the applied voltage Vap is negative. In the variable resistance element 119 of the reference example as recited above, the symmetry of the positive and negative characteristics of the current Ic is high; and the current Ic is large when the applied voltage Vap is negative. Therefore, the effect of the reset disturbance is large. Stable operations are difficult.

Conversely, in the variable resistance element 110 according to the embodiment as shown in FIG. 2, the positive and negative characteristics of the current Ic are asymmetric. The current Ic is extremely small when the applied voltage Vap is negative. Therefore, the effect of the reset disturbance can be suppressed. Stable operations are obtained.

In the one other example of the variable resistance element 110 as shown in FIG. 3B as well, the current Ic is extremely small when the applied voltage Vap is negative. Further, the applied voltage Vap (the reset voltage Vrs) at which the current Ic becomes a prescribed magnitude or less is extremely low (negative and having a large absolute value). The absolute value of the reset voltage Vrs is greater than the absolute value of the set voltage Vs. In such a case, the effect of the reset disturbance can be suppressed further. Stable operations are obtained.

Thus, in the variable resistance element 110 according to the embodiment, the voltage-current characteristic is asymmetric with respect to the positive and negative polarities. An example of the operations of the variable resistance element 110 in which such a characteristic is obtained will now be described.

FIG. 4A to FIG. 4D are schematic views illustrating characteristics of the variable resistance element according to the first embodiment.

Figure 4A:
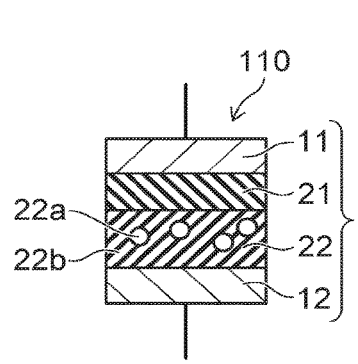
FIG. 4A to FIG. 4D are schematic views illustrating characteristics of the variable resistance element according to the first embodiment.
Figure 4B:
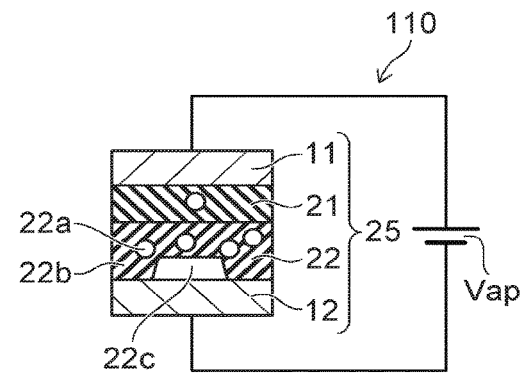
Figure 4C:
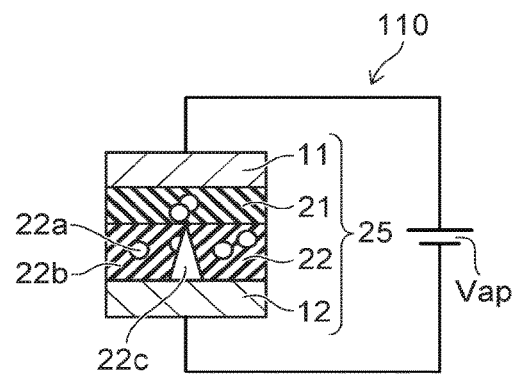
Figure 4D:
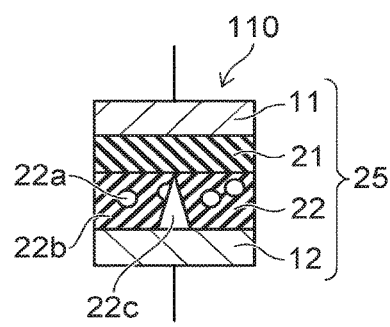

FIG. 4A corresponds to the off-state (the high resistance state STH) of the variable resistance element 110 (the stacked body 25). FIG. 4B corresponds to the state in which the applied voltage Vap is applied to the stacked body 25 in this state. In the example, the applied voltage Vap is positive. FIG. 4C corresponds to the state in which the positive applied voltage Vap is applied continuously. FIG. 4D corresponds to the state in which the applied voltage Vap is removed after the state shown in FIG. 4C.

As shown in FIG. 4B, a filament 22c is formed of the second element 22a (e.g., silver) when the positive applied voltage Vap is applied to the stacked body 25. The filament 22c is formed in the portion of the second layer 22 on the second conductive layer 12 side.

As shown in FIG. 4C, the filament 22c extends toward the first conductive layer 11 side from the second conductive layer 12. There are also cases where a portion (the second element 22a) of the filament 22c enters the first layer 21. At this time, a tunneling current in the first layer 21 is dominant prior to the filament 22c reaching the first conductive layer 11.

Therefore, the growth of the filament 22c stops as shown in FIG. 4D. The tunneling current can flow through the first layer 21 in this state. This state corresponds to the on-state (the low resistance state STL).

FIG. 5A to FIG. 5F are schematic views illustrating characteristics of the variable resistance element according to the first embodiment.

Figure 5A:
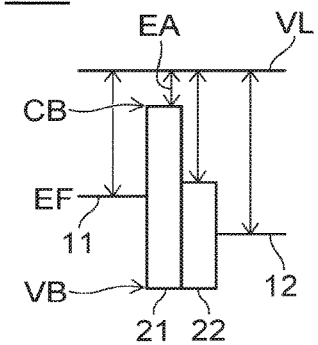
FIG. 5A to FIG. 5F are schematic views illustrating characteristics of the variable resistance element according to the first embodiment.
Figure 5B:
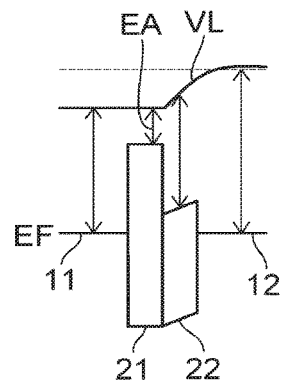
Figure 5C:
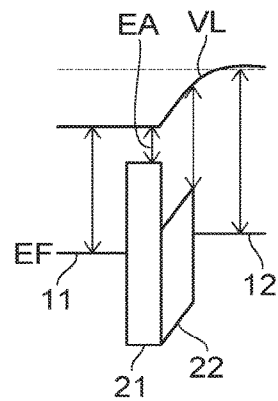
Figure 5D:
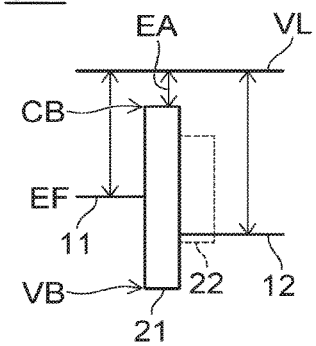
Figure 5E:
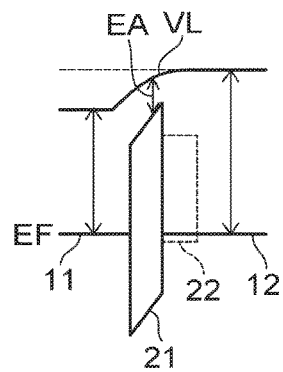
Figure 5F:
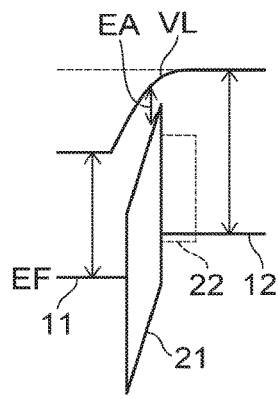

FIG. 5A to FIG. 5C correspond to the off-state (the high resistance state STH). FIG. 5D to FIG. 5F correspond to the on-state (the low resistance state STL). FIG. 5A and FIG. 5D correspond to when the applied voltage Vap is negative. FIG. 5B and FIG. 5E correspond to when the applied voltage Vap is 0. FIG. 5C and FIG. 5F correspond to when the applied voltage Vap is positive. A vacuum level VL, the level of a conduction band CB, the level of a valence band VB, and a Fermi level EF are shown in these figures.

As shown in FIG. 5A, etc., for example, an electron affinity EA of the first layer 21 (the first material) is smaller than the electron affinity EA of the second layer 22 (the second material 22b).

In the low resistance state STL, the first layer 21 functions as a tunneling barrier of the electron current. On the other hand, the filament 22c is formed and the Fermi level EF is formed in the second layer 22. The electrons flow through the first layer 21 due to tunneling conduction. The barrier thickness of the first layer 21 is larger when a negative voltage is applied than when a positive voltage is applied.

For example, in the low resistance state STL in which the filament 22c is formed inside the first layer 21, the resistance is higher when the negative voltage is applied to the first layer 21 than when the positive voltage is applied. Thereby, it is considered that a shape that is asymmetric around the zero voltage is obtained for the current-voltage characteristic.

As shown in FIG. 5A to FIG. 5F, the work function of the first conductive layer 11 is smaller than the work function of the second conductive layer 12. By such a combination of materials, for example, a combination of barriers such as that recited above is obtained; and an operation that utilizes the asymmetry with respect to the positive and negative voltages is obtained.

In the embodiment, it is favorable for the relative dielectric constant of the first layer 21 (the first material) to be higher than the relative dielectric constant of the second material 22b of the second layer 22. Thereby, the filament 22c is formed stably in the portion on the second conductive layer 12 side.

In one example, the first material includes an oxide including at least one selected from the group consisting of Si, Mg, Ca, Hf, Zr, Sc, Ga, Al, Y, La, and Ce. In such a case, the second material 22b includes an oxide including at least one selected from the group consisting of Ta, Nb, Mo, V, Cu, Fe, Mn, Ge, Zn, Gd, and W.

In one example, the first material includes an oxide including at least one selected from the group consisting of Si, Mg, Ca, Al, Y, La, and Ce. In such a case, the second material 22b includes Hf, Zr, Sc, and Ga.

In one example, the first material includes an oxide including at least one selected from the group consisting of Si, Mg, and Ca. In such a case, the second material 22b includes an oxide including at least one selected from the group consisting of Al, Y, La, and Ce.

In one example, the first material includes an oxide including at least one selected from the group consisting of Si, Mg, Ca, Hf, Zr, Sc, Ga, Al, Y, La, and Ce. In such a case, the second material 22b includes a chalcogenide compound.

In one example, the first material includes aluminum oxide. In such a case, the second material 22b includes hafnium oxide.

In one example, the first layer 21 (the first material) includes, for example, at least one selected from the group consisting of SiON, $HfO_2$, $ZrO_2$, $Al_2O_3$, MgO, CaO, $Y_2O_3$, $La_2O_3$, and $CeO_2$. The first layer 21 (the first material) includes, for example, $Al_2O_3$. For example, the first layer 21 can be formed by PVD.

In one example, the second material 22b of the second layer 22 includes an oxide including at least one element selected from the group consisting of Hf, Zr, Sc, Ga, Al, Ta, Nb, Mo, V, Cu, Ge, Ce, La, Gd, Y, and W. The second material of the second layer 22 includes, for example, $HfO_2$. In such a case, the second element 22a is, for example, silver.

The concentration of the second element 22a in the second layer 22 is, for example, not less than $1.1 \times 10^{20}$ atoms/cm$^3$ and not more than $2 \times 10^{22}$ atoms/cm$^3$. When the concentration is a value in this range, for example, the filament 22c is formed stably from the second conductive layer 12 side. In the case where the concentration is less than $1.1 \times 10^{20}$ atoms/cm$^3$, for example, the concentration of the second element 22a (Ag) does not increase easily in the region on the second conductive layer 12 side. In such a case, for example, ions of the first element (Ag) may ionize from the first conductive layer 11, enter the first layer 21, and be reduced; and a filament may be formed undesirably from the first conductive layer 11 side. Thereby, there are cases where it is difficult to obtain the desired rectifying property. On the other hand, in the case where the concentration exceeds $2 \times 10^{22}$ atoms/cm$^3$, the leakage current is large when a positive voltage that is smaller than the set voltage Vs is applied in the high resistance state STH. Therefore, a stable switching operation is not obtained.

In the embodiment, for example, the first layer 21 substantially does not include the second element 22a. Or, in the case where the first layer 21 includes the second element 22a, the concentration of the second element 22a in the second layer 22 is higher than the concentration of the second element 22a in the first layer 21.

For example, the first layer 21 can be formed by PVD (physical vapor deposition). For example, the second layer 22 can be formed by PVD. For example, the first conductive layer 11 and the second conductive layer 12 can be formed by CVD (chemical vapor deposition), etc.

An example of a memory device using the variable resistance element 110 (the stacked body 25) will now be described.

Figure 6A:
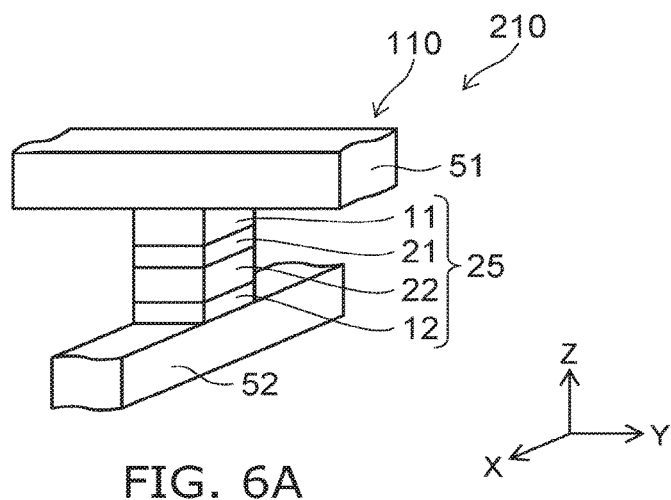
FIG. 6A and FIG. 6B are schematic perspective views illustrating the memory device according to the first embodiment.
Figure 6B:
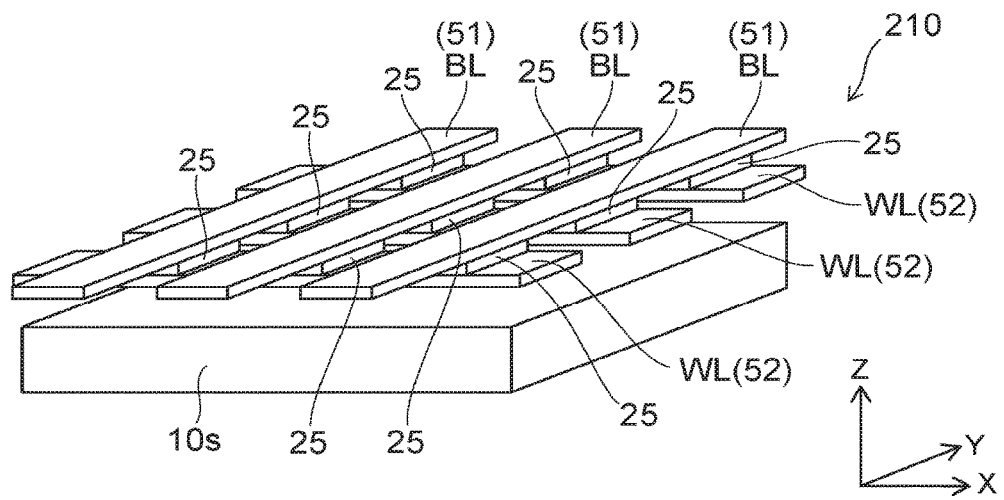

FIG. 6A and FIG. 6B are schematic perspective views illustrating the memory device according to the first embodiment.

As shown in FIG. 6A, the memory device 210 includes the variable resistance element 110 (the stacked body 25), a first interconnect 51, and a second interconnect 52.

The first interconnect 51 is electrically connected to the first conductive layer 11. The second interconnect 52 is electrically connected to the second conductive layer 12. For example, the first interconnect 51 extends in a Y-axis direction. For example, the second interconnect 52 extends in an X-axis direction. The Y-axis direction is perpendicular to the Z-axis direction. The X-axis direction is perpendicular to the Z-axis direction and the Y-axis direction.

The stacked body 25 is provided in a region where a portion of the first interconnect 51 and a portion of the second interconnect 52 overlap in the Z-axis direction.

As shown in FIG. 6B, multiple first interconnects 51 (e.g., bit lines BL) and multiple second interconnects 52 (e.g., word lines WL) may be provided. One stacked body 25 (the variable resistance element 110) is provided at each crossing portion between the multiple first interconnects 51 and the multiple second interconnects 52.

In the example, the interconnects and the variable resistance elements 110 (the stacked bodies 25) are provided on a substrate 10s. The upper surface (e.g., the major surface) of the substrate 10s is aligned with the X-Y plane. In the embodiment, the direction of the major surface of the substrate 10s is arbitrary. For example, the Z-axis direction may be aligned with the major surface of the substrate 10s.

The multiple stacked bodies 25 (the variable resistance elements 110) correspond to multiple memory cells. Information is stored in the multiple memory cells.

Figures 7A, 7B, 7C:
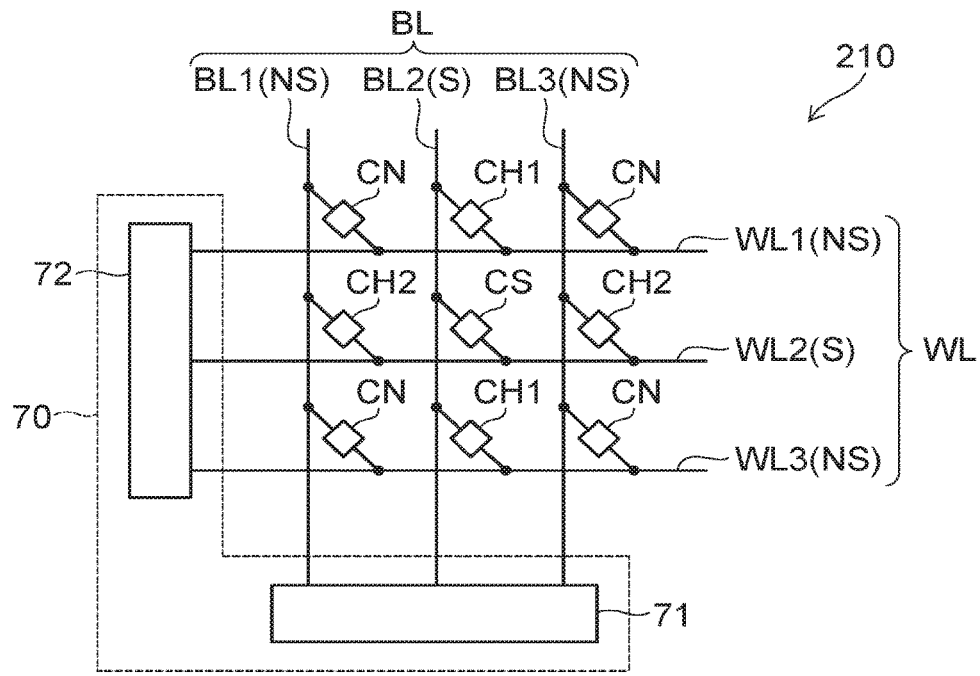
FIG. 7A to FIG. 7C are schematic views illustrating the memory device according to the first embodiment.

FIG. 7A to FIG. 7C are schematic views illustrating the memory device according to the first embodiment.

FIG. 7A is a schematic circuit diagram. FIG. 7B shows one example of the voltages of the memory device. FIG. 7C shows one other example of the voltages of the memory device.

As shown in FIG. 7A, the multiple bit lines BL include, for example, an unselected bit line BL1 (NS), a selected bit line BL2 (S), and an unselected bit line BL3 (NS). These bit lines BL correspond to the first interconnects 51. The multiple word lines WL include, for example, an unselected word line WL1 (NS), a selected word line WL2 (S), and an unselected word line WL3 (NS). These word lines WL correspond to the second interconnects 52.

The multiple bit lines BL are connected to a first circuit 71. The multiple word lines WL are connected to a second circuit 72. The first circuit 71 and the second circuit 72 are included in a controller 70. The potentials of the multiple bit lines BL and the potentials of the multiple word lines WL are controlled by the controller 70 (the first circuit 71 and the second circuit 72). Thus, the memory device 210 may further include the controller 70.

The stacked body 25 that is positioned at the crossing portion between the selected bit line BL2 (S) and the selected word line WL2 (S) corresponds to a selected cell CS. The stacked bodies 25 that are positioned at the crossing portion between the selected bit line BL2 (S) and the unselected word line WL1 (NS) and the crossing portion between the selected bit line BL2 (S) and the unselected word line WL3 (NS) correspond to half-selected cells CH1. The stacked bodies 25 that are positioned at the crossing portion between the unselected bit line BL1 (NS) and the selected word line WL2 (S) and the crossing portion between the unselected bit line BL3 (NS) and the selected word line WL2 (S) correspond to half-selected cells CH2. The stacked bodies that are positioned at the crossing portions between the unselected bit lines and the unselected word lines correspond to unselected cells CN.

FIG. 7B shows one example of the applied voltage Vap (volts (V)) applied to each of the cells in a read operation (Read), a set operation (Set), and a reset operation (Reset). In the example of FIG. 7A, the set voltage Vs is applied to the selected cell CS in the set operation. In such a case, a voltage of "Vs/2" is applied to the half-selected cells CH1 and CH2. In such a case, the applied voltage Vap of the unselected cells CN is 0 V. On the other hand, in the reset operation, the reset voltage Vrs is applied to the selected cell CS. In such a case, a voltage of "−Vrs" is applied to the half-selected cells CH1 and CH2. In such a case, the applied voltage Vap of the unselected cells CN is 0 V. A negative voltage being applied to the half-selected cells corresponds to a reset disturbance. The example corresponds to a "V/2 method." In the "V/2 method," the absolute value of the negative voltage applied to the half-selected cells is ½ of the absolute value of the reset voltage Vrs.

FIG. 7C shows one other example of the applied voltage Vap (volts (V)) applied to the cells in the read operation (Read), the set operation (Set), and the reset operation (Reset). In the example of FIG. 7B, the set voltage Vs is applied to the selected cell CS in the set operation. In such a case, a voltage of "Vs/3" is applied to the half-selected cells CH1 and CH2. In such a case, the applied voltage Vap of the unselected cells CN is 0 V. On the other hand, in the reset operation, the reset voltage Vrs is applied to the selected cell CS. At this time, a voltage of "Vrs/3" is applied to the half-selected cells CH1 and CH2. In such a case, the applied voltage Vap of the unselected cells CN is 0 V. A negative voltage being applied to the half-selected cells corresponds to a reset disturbance. The example corresponds to a "V/3 method." In the "V/3 method," the absolute value of the negative voltage applied to the half-selected cells is ⅓ of the absolute value of the reset voltage Vrs in the example.

For example, the example of FIG. 7B corresponds to an example of a binary memory device. For example, the example of FIG. 7C corresponds to an example of a multi-bit memory device that is greater than binary.

In a voltage setting such as that illustrated in FIG. 7B as well, it is desirable to obtain stable characteristics (a stable difference between the characteristics in the low resistance state STL and the high resistance state STH).

According to the embodiment, stable characteristics are obtained using the "V/3 method" illustrated in FIG. 7C as well.

An example of a characteristic and an example of the setting of the voltages according to the embodiment will now be described.

Figure 8:
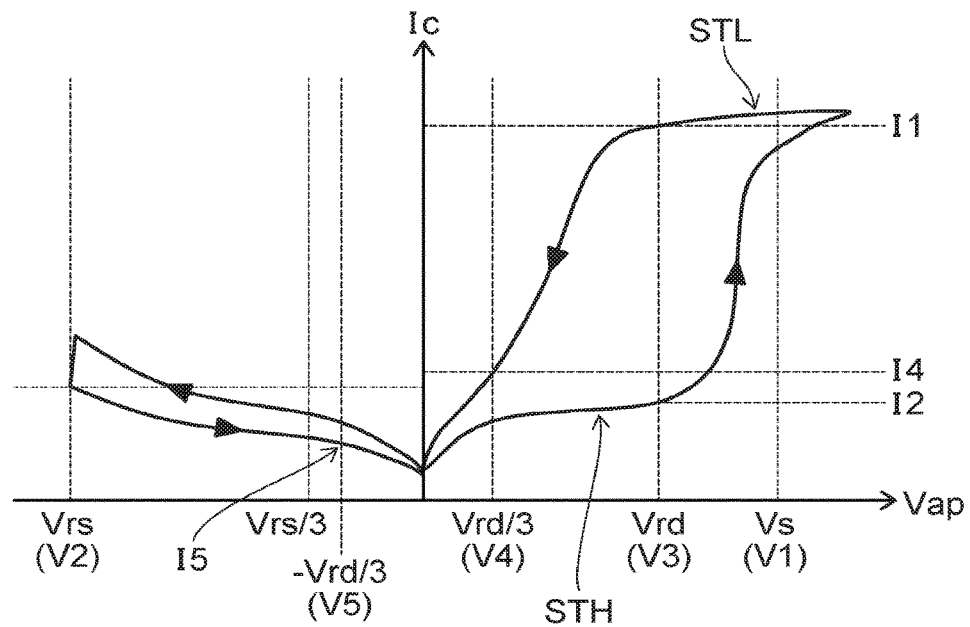
FIG. 8 is a schematic view illustrating a characteristic of the memory device according to the first embodiment.

FIG. 8 is a schematic view illustrating a characteristic of the memory device according to the first embodiment.

The horizontal axis of FIG. 8 is the applied voltage Vap. The vertical axis is the current Ic (logarithmic display).

The applied voltage Vap corresponds to the potential difference between the first conductive layer 11 and the second conductive layer 12. The first conductive layer 11 is electrically connected to the first interconnect 51. The second conductive layer 12 is electrically connected to the second interconnect 52. Practically, the applied voltage Vap may be set to be the potential difference between the first interconnect 51 and the second interconnect 52.

The applied voltage Vap is supplied by the controller 70. The controller 70 is electrically connected to the first interconnects 51 (e.g., the bit lines BL) and the second interconnects 52 (e.g., the word lines WL).

The controller 70 is configured to implement the first operation (the set operation), the second operation (the reset operation), and the third operation (the read operation).

In the first operation (the set operation) as shown in FIG. 8, the controller 70 applies a first voltage V1 (the set voltage Vs) to the first interconnect 51 (the first conductive layer 11). The first voltage V1 is a voltage that is positive when referenced to the potential of the second interconnect 52 (the second conductive layer 12).

In the second operation (the reset operation), the controller 70 applies a second voltage V2 (the reset voltage Vrs) to the first interconnect 51 (the first conductive layer 11). The second voltage V2 is a voltage that is negative when referenced to the potential of the second interconnect 52 (the second conductive layer 12).

In the third operation (the read operation), the controller 70 applies a third voltage V3 (a read voltage Vrd) to the first interconnect 51 (the first conductive layer 11). The third voltage V3 is a voltage that is positive when referenced to the potential of the second interconnect 52 (the second conductive layer 12). The third voltage V3 is smaller than the first voltage V1.

In the low resistance state STL, the current Ic for the third voltage V3 (the read voltage Vrd) corresponds to a first current I1. In the high resistance state STH, the current Ic for the third voltage V3 (the read voltage Vrd) corresponds to a second current I2. Thus, the absolute value of the current Ic (the first current I1) flowing in the stacked body 25 via the first interconnect 51 and the second interconnect 52 in the third operation (the read operation) implemented after the first operation (the set operation) is greater than the absolute value of the current Ic (the second current I2) flowing in the stacked body 25 in the third operation (the read operation) implemented after the second operation (the reset operation). Thus, the current Ic that flows when the same read voltage Vrd is applied is different between the low resistance state STL and the high resistance state STH.

The voltage (a positive voltage) of ⅓ of the third voltage V3 (the read voltage Vrd) is taken as a fourth voltage V4 (Vrd/3). In the low resistance state STL, the current Ic for the fourth voltage V4 (Vrd/3) corresponds to a fourth current I4. On the other hand, a fifth voltage V5 (−Vrd/3) is a negative voltage; and the absolute value of the fifth voltage V5 is ⅓ of the read voltage Vrd. In the low resistance state STL, the current Ic for the fifth voltage V5 (−Vrd/3) corresponds to a fifth current I5.

The absolute value of the current Ic (the fourth current I4) flowing in the stacked body 25 via the first interconnect 51 and the second interconnect 52 when the fourth voltage V4 (a voltage that is positive when referenced to the potential of the second interconnect 52) is applied to the first interconnect 51 is greater than the absolute value of the fifth current I5 flowing in the stacked body 25 via the first interconnect 51 and the second interconnect 52 when the fifth voltage V5 (a voltage that is negative when referenced to the potential of the second interconnect 52) is applied to the first interconnect 51. As described above, the fourth voltage V4 is ⅓ of the third voltage V3. The absolute value of the fifth voltage V5 is ⅓ of the third voltage V3.

Because the fourth current I4 when applying the fourth voltage V4 that is positive and has the absolute value of ⅓ of the read voltage Vrd (the third voltage V3) is larger than the fifth current I5 when applying the fifth voltage V5 that is negative and has the absolute value of ⅓ of the read voltage Vrd (the third voltage V3), in the case where the operation of the "V/3 method" recited above is performed as well, a stable difference of the currents (difference of the electrical resistances) between the low resistance state STL and the high resistance state STH is obtained when the read voltage Vrd is applied in the third operation. For example, multi-bit storing is obtained stably.

The variable resistance element 119 of the reference example (referring to FIG. 3A and FIG. 3B) is reset easily because similar currents flow on the negative voltage side and on the positive voltage side. Conversely, in the variable resistance element 110 according to the embodiment, the error of being erroneously reset is suppressed because the current on the negative voltage side is small. Thus, according to the embodiment, a stable array operation that is resistant to the reset disturbance is obtained.

In the embodiment, the absolute value of the first voltage V1 (the set voltage Vs) may be less than the absolute value of the second voltage V2 (the reset voltage Vrs) (referring to FIG. 3B). Thereby, more stable memory operations can be implemented. For example, the absolute value of the fifth voltage V5 recited above is less than ⅓ of the absolute value of the second voltage V2.

The first current I1 (the absolute value) recited above is, for example, not less than 100 times the fourth current I4 (the absolute value). Stable storing and read operations can be implemented using such a large difference.

Second Embodiment

Figure 9:
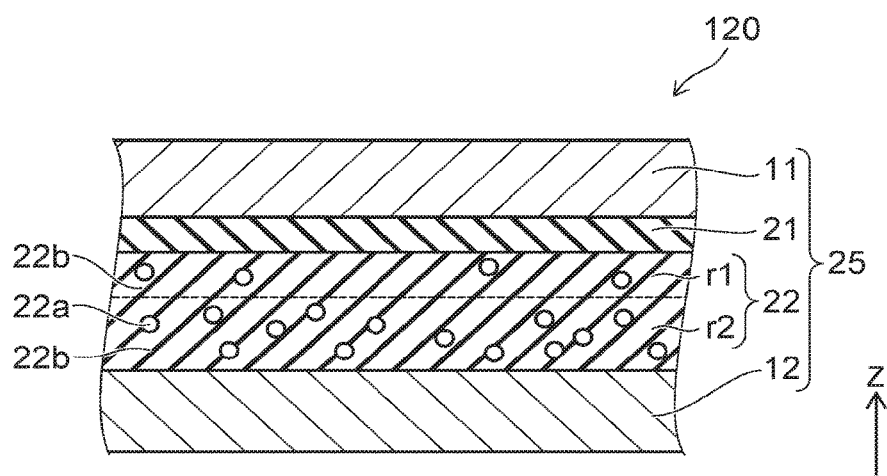
FIG. 9 is a schematic cross-sectional view illustrating a variable resistance element according to a second embodiment.

FIG. 9 is a schematic cross-sectional view illustrating a variable resistance element according to a second embodiment.

As shown in FIG. 2, the variable resistance element 120 according to the embodiment also includes the first conductive layer 11, the second conductive layer 12, the first layer 21, and the second layer 22. In the variable resistance element 120, the characteristics are different between two regions (a first region r1 and a second region r2) in the second layer 22. The first conductive layer 11, the second conductive layer 12, and the first layer 21 are similar to those of the variable resistance element 110; and a description is therefore omitted.

In the second layer 22, the second region r2 is provided between the first region r1 and the second conductive layer 12. The concentration of the second element 22a (e.g., silver) included in the first region r1 is lower than the concentration of the second element 22a included in the second region r2. There may be a case where the first region r1 substantially does not include the second element 22a. In the variable resistance element 120, more stable operations are obtained as described below.

Figures 10A, 10B, 10C:
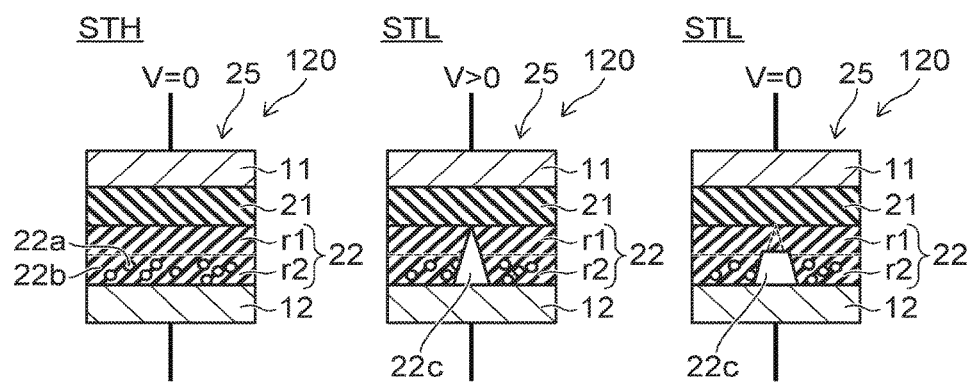
FIG. 10A to FIG. 10C are schematic views illustrating characteristics of the variable resistance element according to the second embodiment.

FIG. 10A to FIG. 10C are schematic views illustrating characteristics of the variable resistance element according to the second embodiment.

FIG. 10A corresponds to the off-state (the high resistance state STH) of the variable resistance element 110 (the stacked body 25). FIG. 10B corresponds to the state in which a positive applied voltage Vap is applied to the stacked body 25 in this state. FIG. 10C corresponds to the state in which the applied voltage is 0 V after the positive applied voltage Vap is applied.

FIG. 10A corresponds to the high resistance state STH.

As shown in FIG. 10B, a positive applied voltage Vap that is higher than the set voltage Vs is applied to the first conductive layer 11 in the high resistance state STH. Thereby, the filament 22c is formed from the second conductive layer 12 toward the first conductive layer 11. Inside the second layer 22, a thick and stable filament is formed in the region (the second region r2) where the concentration of the second element 22a (e.g., silver) is high. On the other hand, a fine unstable filament 22c is formed in the region (the first region r1) where the concentration of the second element 22a is low.

Therefore, when the applied voltage Vap is returned to 0 as shown in FIG. 10C, the second element 22a undesirably diffuses from the filament 22c inside the first region r1; and the filament 22c that is in the first region r1 disappears.

The filament 22c is re-formed in the first region r1 when reading the low resistance state by applying the read voltage Vrd (the positive voltage) to the first conductive layer 11. As a result, the current Ic increases abruptly for a voltage that is higher than some threshold voltage. The high nonlinearity (the rectifying property) of the current Ic around the threshold voltage is obtained.

For example, when applying the read voltage Vrd to the selected cell CS in a memory device in which multiple memory cells are provided, for example, a voltage of Vrd/3 is applied according to the operation method to the cells (the half-selected cells) that are connected to the same bit line and word line as the selected cell CS. In the embodiment, the ratio of the current Ic for the read voltage Vrd to the current Ic for the voltage of Vrd/3 is sufficiently greater than 100. Thus, a large nonlinearity is obtained. Thereby, read errors in the read operation can be suppressed. Thereby, stable operations are obtained. Even in the case where the range of the applied voltage Vap is low and small, a stable memory operation is obtained. Thereby, the power consumption can be reduced.

According to the embodiment, a variable resistance element and a memory device can be provided that are resistant to the reset disturbance in which a negative voltage is applied.

According to the embodiment, a variable resistance element and a memory device can be provided in which stable operations are possible.

In this specification, the state of being electrically connected includes the state in which two conductors are in direct contact. The state of being electrically connected includes the state in which two conductors are connected by another conductor (e.g., an interconnect, etc.). The state of being electrically connected includes the state in which a switching element (a transistor or the like) is provided on a path between two conductors, and a state is formable in which a current flows in the path between the two conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in variable resistance elements and memory devices such as conductive layers, layers, interconnects, and controller etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A variable resistance element, comprising:
    a first conductive layer including a first element including at least one selected from the group consisting of silver, copper, aluminum, nickel, and titanium;
    a second conductive layer including at least one selected from the group consisting of platinum, gold, iridium, tungsten, palladium, rhodium, titanium nitride, and silicon;
    a first layer contacting the first conductive layer, being provided between the first conductive layer and the second conductive layer, and including a first material, the first material being insulative; and
    a second layer including a second element and a second material and being provided between the first layer and the second conductive layer, the second element including at least one selected from the group consisting of silver, copper, aluminum, nickel, and titanium, the second material being different from the first material,
    wherein
    a thickness of the first layer is thinner than a thickness of the second layer.

2. The variable resistance element according to claim 1, wherein the second material includes an oxide.

3. The variable resistance element according to claim 1, wherein an electron affinity of the first material is smaller than an electron affinity of the second material.

4. The variable resistance element according to claim 2, wherein
    the first material includes an oxide including at least one selected from the group consisting of Si, Mg, Ca, Hf, Zr, Sc, Ga, Al, Y, La, and Ce, and
    the oxide included in the second material includes at least one selected from the group consisting of Ta, Nb, Mo, V, Cu, Fe, Mn, Ge, Zn, Gd, and W.

5. The variable resistance element according to claim 2, wherein
    the first material includes an oxide including at least one selected from the group consisting of Si, Mg, Ca, Al, Y, La, and Ce, and
    the oxide included in the second material includes at least one selected from the group consisting of Hf, Zr, Sc, and Ga.

6. The variable resistance element according to claim 2, wherein
    the first material includes an oxide including at least one selected from the group consisting of Si, Mg, and Ca, and
    the oxide included in the second material includes at least one selected from the group consisting of Al, Y, La, and Ce.

7. The variable resistance element according to claim 1, wherein a relative dielectric constant of the first material is higher than a relative dielectric constant of the second material.

8. The variable resistance element according to claim 1, wherein a concentration of the second element in the second layer is $1\times10^{20}$ atoms/cm$^3$ or more.

9. The variable resistance element according to claim 1, wherein the first material includes aluminum oxide.

10. The variable resistance element according to claim 1, wherein the second material includes hafnium oxide.

11. The variable resistance element according to claim 1, wherein
    a thickness of the first layer is not less than 0.2 nanometers and not more than 1.5 nanometers, and
    a thickness of the second layer is greater than 1.5 nanometers and not more than 10 nanometers.

12. The variable resistance element according to claim 1, wherein
    the first material includes aluminum oxide,
    the second material includes hafnium oxide,
    the first layer does not include the second element, or
    the first layer includes the second element, and a concentration of the second element in the second layer is higher than a concentration of the second element in the first layer.

13. A memory device, comprising:
    the variable resistance element according to claim 1;
    a first interconnect electrically connected to the first conductive layer;
    a second interconnect electrically connected to the second conductive layer; and
    a controller electrically connected to the first interconnect and the second interconnect, the controller implementing:
        a first operation of applying a first voltage to the first interconnect, the first voltage being positive when referenced to a potential of the second interconnect,
        a second operation of applying a second voltage to the first interconnect, the second voltage being negative when referenced to the potential of the second interconnect, and
        a third operation of applying a third voltage to the first interconnect, the third voltage being smaller than the first voltage and being positive when referenced to the potential of the second interconnect,
    the absolute value of a first current flowing in a stacked body via the first interconnect and the second interconnect in the third operation implemented after the first operation is greater than the absolute value of a second current flowing in the stacked body in the third operation implemented after the second operation, the stacked body including the first conductive layer, the second conductive layer, the first layer, and the second layer, and
    the absolute value of a fourth current flowing in the stacked body via the first interconnect and the second interconnect when a fourth voltage is applied to the first interconnect is greater than the absolute value of a fifth current flowing in the stacked body via the first interconnect and the second interconnect when a fifth voltage is applied to the first interconnect, the fourth voltage being positive when referenced to the potential of the second interconnect, the fifth voltage being negative when referenced to the potential of the second interconnect, the fourth voltage being ⅓ of the third voltage, the absolute value of the fifth voltage being ⅓ of the third voltage.

14. The device according to claim 13, wherein the absolute value of the first voltage is less than the absolute value of the second voltage.

15. The device according to claim 13, wherein the absolute value of the first current is not less than 100 times the absolute value of the fourth current.

16. The device according to claim 13, wherein the absolute value of the fifth voltage is less than ⅓ of the absolute value of the second voltage.

17. A variable resistance element, comprising:
a first conductive layer including a first element including at least one selected from the group consisting of silver, copper, aluminum, nickel, and titanium;
a second conductive layer including at least one selected from the group consisting of platinum, gold, iridium, tungsten, palladium, rhodium, titanium nitride, and silicon;
a first layer contacting the first conductive layer, being provided between the first conductive layer and the second conductive layer, and including a first material, the first material being insulative; and
a second layer including a second element and a second material and being provided between the first layer and the second conductive layer, the second element including at least one selected from the group consisting of silver, copper, aluminum, nickel, and titanium, the second material being different from the first material,
wherein
the first layer does not include the second element, or
the first layer includes the second element, and a concentration of the second element in the second layer is higher than a concentration of the second element in the first layer.

18. The variable resistance element according to claim 17, wherein the second material includes an oxide.

19. The variable resistance element according to claim 17, wherein an electron affinity of the first material is smaller than an electron affinity of the second material.

20. The variable resistance element according to claim 18, wherein
the first material includes an oxide including at least one selected from the group consisting of Si, Mg, Ca, Hf, Zr, Sc, Ga, Al, Y, La, and Ce, and
the oxide included in the second material includes at least one selected from the group consisting of Ta, Nb, Mo, V, Cu, Fe, Mn, Ge, Zn, Gd, and W.

21. The variable resistance element according to claim 18, wherein
the first material includes an oxide including at least one selected from the group consisting of Si, Mg, Ca, Al, Y, La, and Ce, and
the oxide included in the second material includes at least one selected from the group consisting of Hf, Zr, Sc, and Ga.

22. The variable resistance element according to claim 18, wherein
the first material includes an oxide including at least one selected from the group consisting of Si, Mg, and Ca, and
the oxide included in the second material includes at least one selected from the group consisting of Al, Y, La, and Ce.

23. The variable resistance element according to claim 17, wherein a relative dielectric constant of the first material is higher than a relative dielectric constant of the second material.

24. The variable resistance element according to claim 17, wherein a concentration of the second element in the second layer is $1 \times 10^{20}$ atoms/cm$^3$ or more.

25. The variable resistance element according to claim 17, wherein the first material includes aluminum oxide.

26. The variable resistance element according to claim 17, wherein the second material includes hafnium oxide.

27. The variable resistance element according to claim 17, wherein
a thickness of the first layer is not less than 0.2 nanometers and not more than 1.5 nanometers, and
a thickness of the second layer is greater than 1.5 nanometers and not more than 10 nanometers.

28. The variable resistance element according to claim 17, wherein
the first material includes aluminum oxide,
the second material includes hafnium oxide,
the first layer does not include the second element, or
the first layer includes the second element, and a concentration of the second element in the second layer is higher than a concentration of the second element in the first layer.

29. A memory device, comprising:
the variable resistance element according to claim 17,
a first interconnect electrically connected to the first conductive layer;
a second interconnect electrically connected to the second conductive layer; and
a controller electrically connected to the first interconnect and the second interconnect, the controller implementing:
a first operation of applying a first voltage to the first interconnect, the first voltage being positive when referenced to a potential of the second interconnect,
a second operation of applying a second voltage to the first interconnect, the second voltage being negative when referenced to the potential of the second interconnect, and
a third operation of applying a third voltage to the first interconnect, the third voltage being smaller than the first voltage and being positive when referenced to the potential of the second interconnect,
the absolute value of a first current flowing in a stacked body via the first interconnect and the second interconnect in the third operation implemented after the first operation is greater than the absolute value of a second current flowing in the stacked body in the third operation implemented after the second operation, the stacked body including the first conductive layer, the second conductive layer, the first layer, and the second layer, and
the absolute value of a fourth current flowing in the stacked body via the first interconnect and the second interconnect when a fourth voltage is applied to the first interconnect is greater than the absolute value of a fifth current flowing in the stacked body via the first interconnect and the second interconnect when a fifth voltage is applied to the first interconnect, the fourth voltage being positive when referenced to the potential of the second interconnect, the fifth voltage being negative when referenced to the potential of the second interconnect, the fourth voltage being ⅓ of the third voltage, the absolute value of the fifth voltage being ⅓ of the third voltage.

30. A variable resistance element, comprising:
a first conductive layer including a first element including at least one selected from the group consisting of silver, copper, aluminum, nickel, and titanium;
a second conductive layer including at least one selected from the group consisting of platinum, gold, iridium, tungsten, palladium, rhodium, titanium nitride, and silicon;
a first layer contacting the first conductive layer, being provided between the first conductive layer and the second conductive layer, and including a first material, the first material being insulative; and a second layer including a second element and a second material and being provided between the first layer and the second conductive layer, the second element including at least one selected from the group consisting of silver, copper, aluminum, nickel, and titanium, the second material being different from the first material, wherein the second layer includes a first region and a second region, the second region being provided between the first region and the second conductive layer, and a concentration of the second element included in the first region is lower than a concentration of the second element included in the second region.

* * * * *

UNITED STATES PATENT AND TRADEMARK OFFICE
CERTIFICATE OF CORRECTION

PATENT NO.         : 10,312,440 B2                                          Page 1 of 1
APPLICATION NO.    : 15/704112
DATED              : June 4, 2019
INVENTOR(S)        : Hiromichi Kuriyama et al.

It is certified that error appears in the above-identified patent and that said Letters Patent is hereby corrected as shown below:

On the Title Page

Item (73), the Assignee is incorrect. Item (73) should read:
-- (73) Assignee: Toshiba Memory Corporation, Minato-ku (JP) --

Signed and Sealed this
Seventh Day of April, 2020

Andrei Iancu
*Director of the United States Patent and Trademark Office*